(12) United States Patent
Zhang et al.

(10) Patent No.: US 7,727,870 B2
(45) Date of Patent: Jun. 1, 2010

(54) METHOD OF MAKING A SEMICONDUCTOR DEVICE USING A STRESSOR

(75) Inventors: Da Zhang, Austin, TX (US);
Xiangzheng Bo, Austin, TX (US);
Venkat R. Kolagunta, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 315 days.

(21) Appl. No.: 11/737,496

(22) Filed: Apr. 19, 2007

(65) Prior Publication Data

US 2008/0261362 A1 Oct. 23, 2008

(51) Int. Cl.
*H01L 21/3205* (2006.01)
(52) U.S. Cl. ............... 438/589; 438/761; 257/E21.176
(58) Field of Classification Search ............ 438/589, 438/761, 199; 257/19
See application file for complete search history.

(56) References Cited

U.S. PATENT DOCUMENTS

| 6,573,172 | B1 | 6/2003 | En et al. | |
|---|---|---|---|---|
| 6,621,131 | B2 | 9/2003 | Murthy et al. | |
| 7,514,309 | B2 * | 4/2009 | Sridhar et al. | 438/199 |
| 2007/0141775 | A1 | 6/2007 | Teo et al. | |
| 2007/0184600 | A1 * | 8/2007 | Zhang et al. | 438/199 |
| 2007/0202653 | A1 | 8/2007 | Hoentschel et al. | |
| 2008/0153221 | A1 * | 6/2008 | Sridhar et al. | 438/230 |
| 2008/0233738 | A1 * | 9/2008 | Beyer et al. | 438/643 |
| 2008/0237737 | A1 * | 10/2008 | Chen et al. | 257/382 |
| 2008/0251851 | A1 * | 10/2008 | Pan et al. | 257/369 |
| 2009/0026550 | A1 * | 1/2009 | Manabe | 257/369 |

OTHER PUBLICATIONS

Boeuf et al; "A Conventional 45nm CMOS node Low-Cost Platform for General Purpose and Low Power Applications"; Electron Devices Meeting, 2004. IEDM Technical Digest. IEEE International Dec. 13-15, 2004 pp. 425-428.

* cited by examiner

*Primary Examiner*—Phat X Cao
*Assistant Examiner*—Nga Doan
(74) *Attorney, Agent, or Firm*—James L. Clingan, Jr.; Ranjeev Singh (57) ABSTRACT

A method for forming a semiconductor device includes providing a substrate and forming a p-channel device and an n-channel device, each of the p-channel device and the n-channel device comprising a source, a drain, and a gate, the p-channel device having a first sidewall spacer and the n-channel device having a second sidewall spacer. The method further includes forming a liner and forming a tensile stressor layer over the liner and removing a portion of the tensile stressor layer from a region overlying the p-channel device. The method further includes transferring a stress characteristic of an overlying portion of a remaining portion of the tensile stressor layer to a channel of the n-channel device. The method further includes using the remaining portion of the tensile stressor layer as a hard mask, forming a first recess and a second recess adjacent the gate of the p-channel device.

16 Claims, 6 Drawing Sheets

METHOD OF MAKING A SEMICONDUCTOR DEVICE USING A STRESSOR

CROSS-REFERENCE TO RELATED APPLICATION(S)

This application is related to U.S. patent application Ser. No. 11/737,492, filed on even date, titled "Method of Making a Semiconductor With a Stressor," naming Sinan Goktepeli and Venkat Kolagunta as inventors, and assigned to the current assignee hereof.

BACKGROUND

1. Field

This disclosure relates generally to semiconductor devices, and more specifically, to semiconductor devices that utilize a stressor.

2. Related Art

One of the techniques for improving performance of MOS transistors is to provide stress to the channels. Providing tensile stress to the channels of N channel transistors increases electron mobility to enhance performance. Providing compressive stress to the channels of P channel transistors increases hole mobility to enhance performance. A variety of techniques have been developed to achieve these results. One is to provide a recess in the source/drain regions and then regrow the source/drain region with a semiconductor stressor material that provides stress to the channel. Another technique is to deposit a film, after gate formation, that has stress that is transferred to the channel. Under proper circumstances the stress of the deposited film can be transferred to the channel and then retained by the channel even after the deposited film has been removed. These approaches and combinations of these approaches tend to cause other problems.

Thus there is a need to be able to use multiple stress inducing techniques while reducing the problems associated with combining the multiple techniques but not at the expense of losing the intended stress benefit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect a P channel transistor has a stress caused by source/drain stressor and an N channel transistor has a retained stress from a removable stressor layer. The P and N channel transistor can each have a different additional stressor layer as well. While the removable stressor layer is still present for the N channel transistor, recesses are formed in the source/drain regions of the P channel transistor, and silicon germanium (SIGe) is regrown to provide compressive stress. The SiGe is grown with in situ boron doping so that a source/drain implant is not required. After the doped SiGe layer is grown, an additional growth of undoped semiconductor is grown on the doped SiGe layer. During the removal of the removable stressor layer, the undoped semiconductor is minimally effected by the etchant materials and protects the doped SiGe layer. The doped SiGe layer would, if not protected, be etched in ways that are difficult to control during the removal of the layer for the memory stress. Silicide is then formed for both the N and P channel transistors. The silicide process completely consumes the undoped semiconductor layer. This is better understood by reference to the FIGs. and the following description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
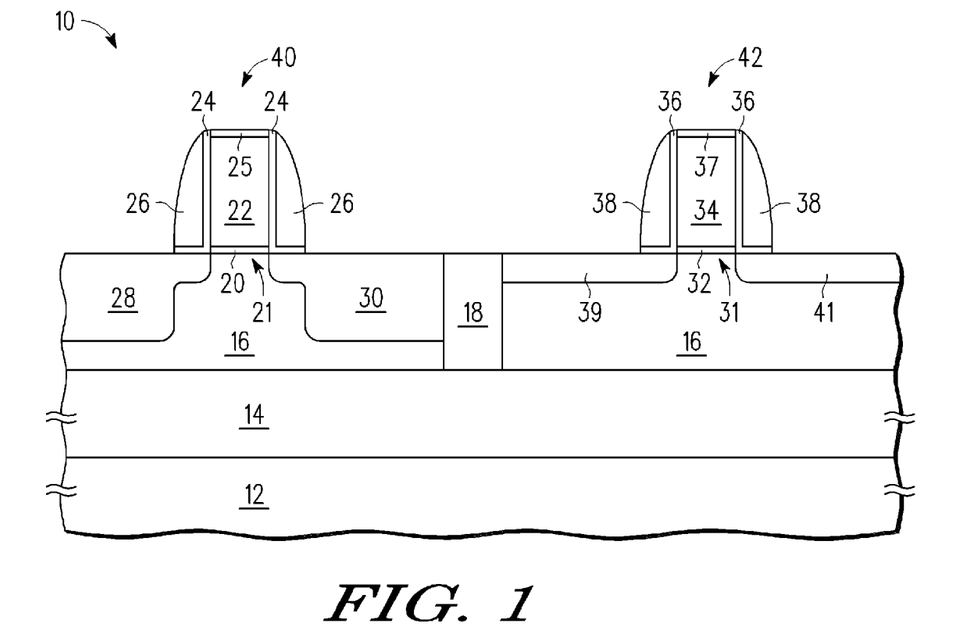
FIG. 1 is a semiconductor device at a stage in processing according to an embodiment of the invention.

Shown in FIG. 1 is a semiconductor device 10, which includes an N channel region 40 which is used to form an N channel transistor and a P channel region 42 which is used to form a P channel transistor. N channel region 40 comprises a semiconductor supporting substrate 12, an insulating layer 14 on substrate 12, and a semiconductor layer 16 on insulating layer 14, a gate dielectric 20 over semiconductor layer 16, a gate electrode 22 over gate dielectric 20, a source/drain 28 in semiconductor layer 16 and substantially aligned to one side of gate 22, a source/drain 30 in semiconductor layer 16 and substantially aligned to an opposite side of gate 22, a liner 24 surrounding gate 22, a capping layer 25 on gate electrode 22, and a sidewall spacer 26 on liner 24 and surrounding gate 22. A channel 21 is in semiconductor layer 16 in the region between source/drain regions 28 and 30 immediately under gate dielectric 20.

P channel region 42 also comprises semiconductor supporting substrate 12, insulating layer 14 on substrate 12, and semiconductor layer 16 on insulating layer 14. An isolation region 18 extends through semiconductor layer 16 to insulating layer 14 and separates N channel region 40 from P channel region 42. P channel region 42 further comprises a gate dielectric 32 over semiconductor layer 16, a gate electrode 34 over gate dielectric 32, a source/drain extension 39 in semiconductor layer 16 and substantially aligned to one side of gate 34, a source/drain extension 41 in semiconductor layer 16 and substantially aligned to an opposite side of gate 34, a liner 36 surrounding gate 34, a capping layer 37 on gate electrode 34, and a sidewall spacer 38 on liner 36 and surrounding gate 34. A channel 31 is in semiconductor layer 16 in the region between source/drain extensions 39 and 41 immediately under gate dielectric 32.

In this example, semiconductor supporting substrate 12 comprises silicon, insulating layer 14 comprises oxide, semiconductor layer 16 comprises silicon, isolation region 18 comprises oxide, liners 24 and 36 comprise oxide, spacers 26 and 38 comprise nitride, capping layers 25 and 37 comprise nitride, and gate electrodes 22 and 34 comprise polysilicon. These materials may vary. For example, gate electrodes 22 and 34 may comprise a combination of layers in which one or more of the layers may be metal and the metals may be different for gate electrodes 22 and 34. The thickness of gate electrodes 22 and 34 may be about 1000 Angstroms. The width of sidewall spacers 26 may be about half the height of gate electrode 22. The dimensions are exemplary and could vary significantly. Gate dielectrics 20 and 32 may be about 20 Angstroms for the case of being oxide. This dimension could vary significantly, especially if another material is used such as a high k dielectric such as a metal oxide. Although channels 21 and 31 for the N and P channels are shown as being in the same semiconductor layer separated by isolation region 18, they may be different, especially differently doped for their different purposes of being for N and P channel transistors.

Figure 2:
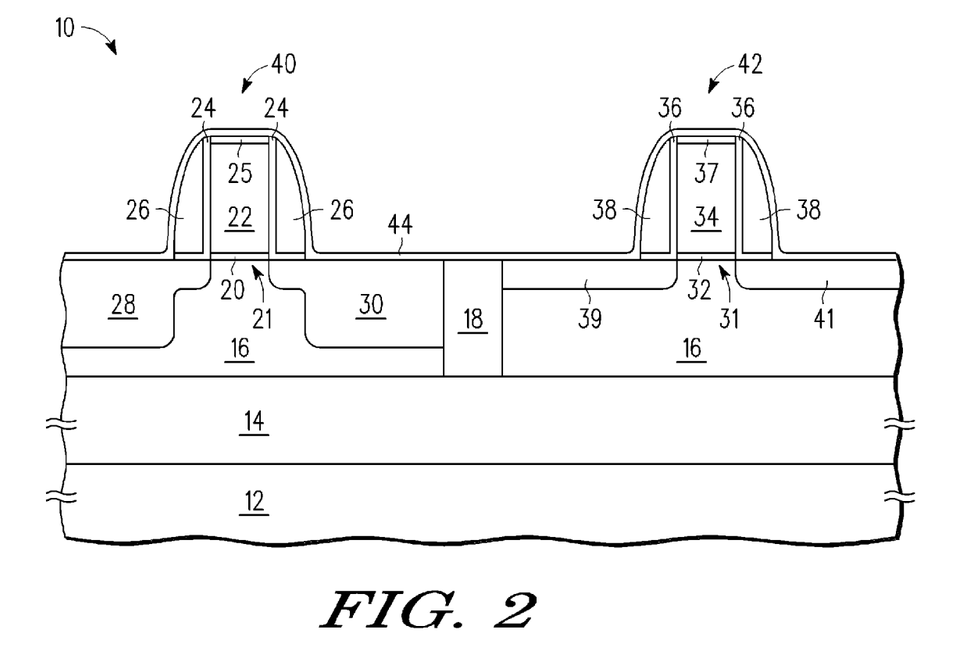
FIG. 2 is the semiconductor device 1 at a subsequent stage in processing.

Shown in FIG. 2 is semiconductor device 10 after depositing an oxide liner 44. The oxide liner is preferably about 100 Angstroms thick. Liner 44, because it is deposited, covers both regions 40 and 42.

Figure 3:
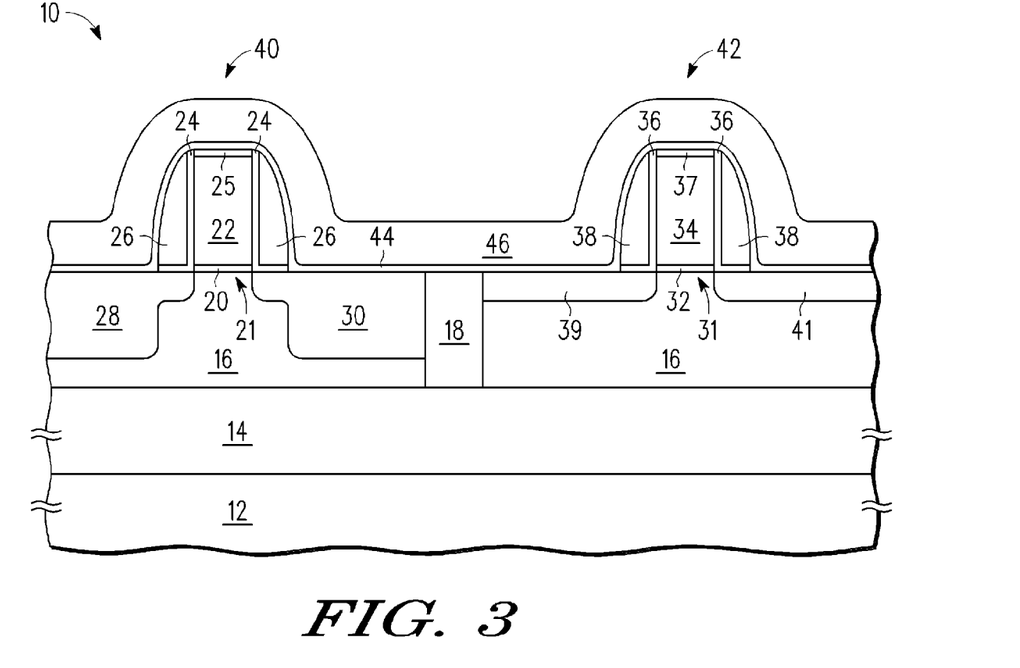
FIG. 3 is the semiconductor device 2 at a subsequent stage in processing; . . .

Shown in FIG. 3 is semiconductor device 10 after depositing a removable stressor layer 46 over regions 40 and 42. Stressor layer 46 in this example is nitride with tensile stress and a thickness of about 800 Angstroms.

Figure 4:
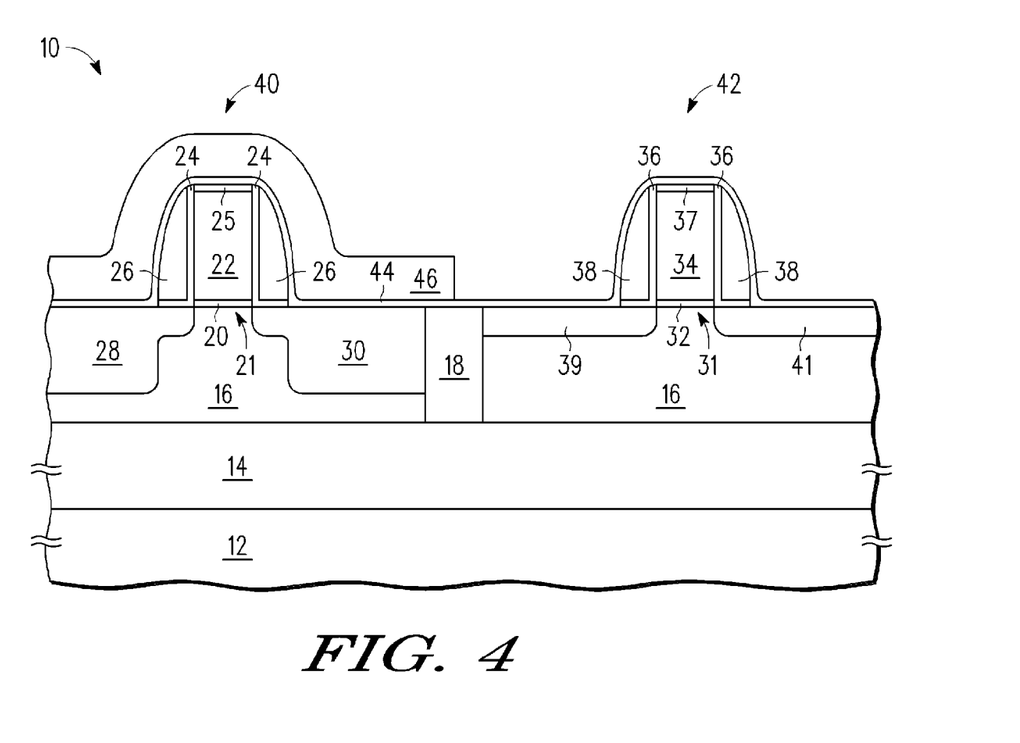
FIG. 4 is the semiconductor device 3 at a subsequent stage in processing.

Shown in FIG. 4 is semiconductor device 10 after removing stressor layer 46 from over region 42. This is a patterned etch that stops on liner 44. After removal of stressor layer 46 from over region 42 a relatively high temperature anneal is used to transfer the stress of stressor layer 46 to channel 20. An effective anneal is a rapid thermal anneal (RTA) with a peak of 1000-1100 degrees Celsius. Other types and temperatures may also be effective. A laser anneal at 1325 degrees Celsius may be preferred for example. The optimum anneal will depend on the stressor layer that is deposited and should be experimentally determined.

Figure 5:
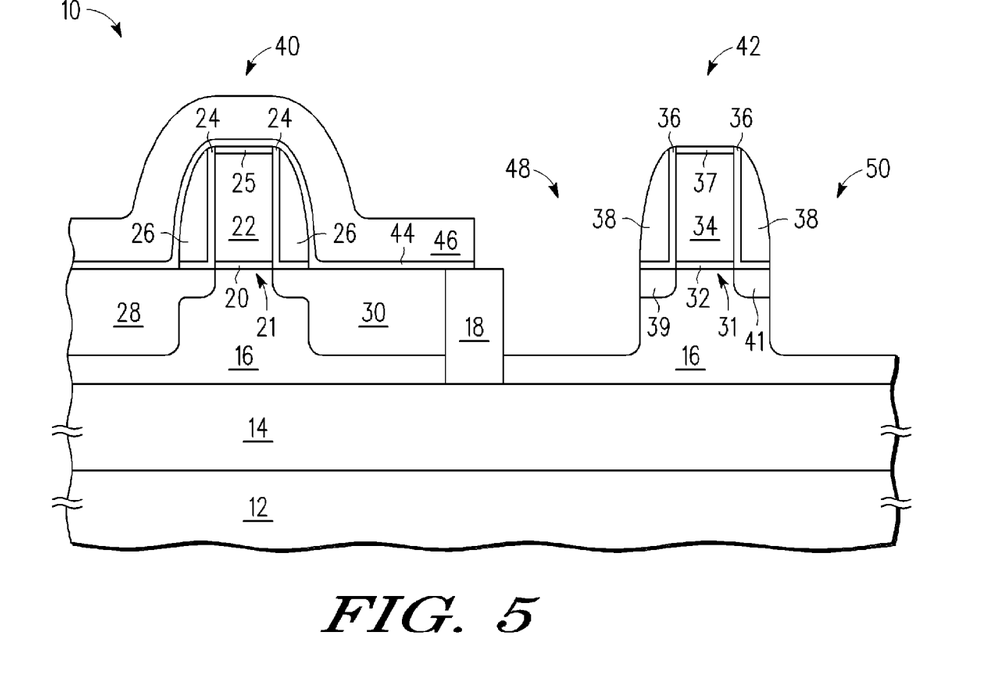
FIG. 5 is the semiconductor device 4 at a subsequent stage in processing.

Shown in FIG. 5 is semiconductor device 10 after forming a recess 48 in region 42 using sidewall spacer 38 as a mask on one side of gate electrode 34 and recess 50 using sidewall spacer 38 on an opposite side of gate electrode 34. Recesses 48 and 50 are about the same depth as source/drain regions 28 and 30 of region 40. Liner 44 not covered by stressor layer 46 is removed prior to performing the source/drain etch, which is a conventional etch for recess formation, that forms recesses 48 and 50. Although not shown for this example, the source/drain etch may form undercuts below the source/drain spacers.

Figure 6:
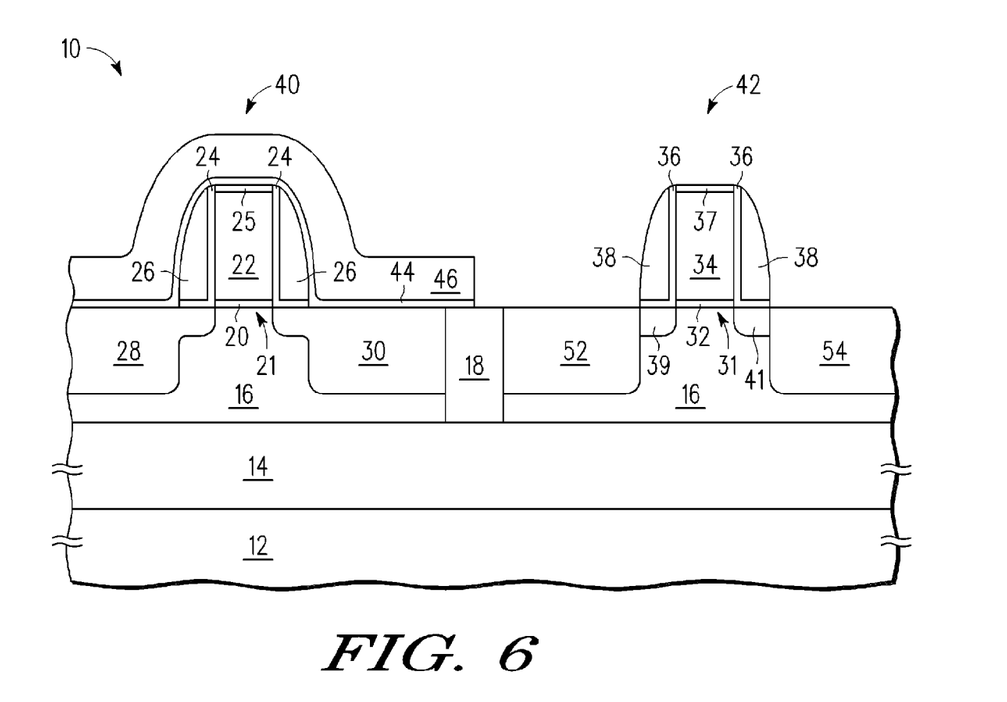
FIG. 6 is the semiconductor device 5 at a subsequent stage in processing.

Shown in FIG. 6 is semiconductor device 10 after forming silicon germanium (SiGe) layers 52 and 54 in recesses 48 and 50, respectively. This is a conventional epitaxial growth to cause compressive stress to channel 31. SiGe is chosen for the semiconductor growth. This epitaxial growth includes boron, the common source/drain dopant for P channel transistors. This avoids the need for a subsequent implant. An implant would have the adverse affect of reducing the compressive stress applied by SiGe layers 52 and 54 to channel 31. SiGe layers 52 and 54 also function as source/drains. Stressor layer 46 thus acts as a mask to prevent semiconductor growth in region 40 during the growth of semiconductor layers 52 and 54.

Figure 7:
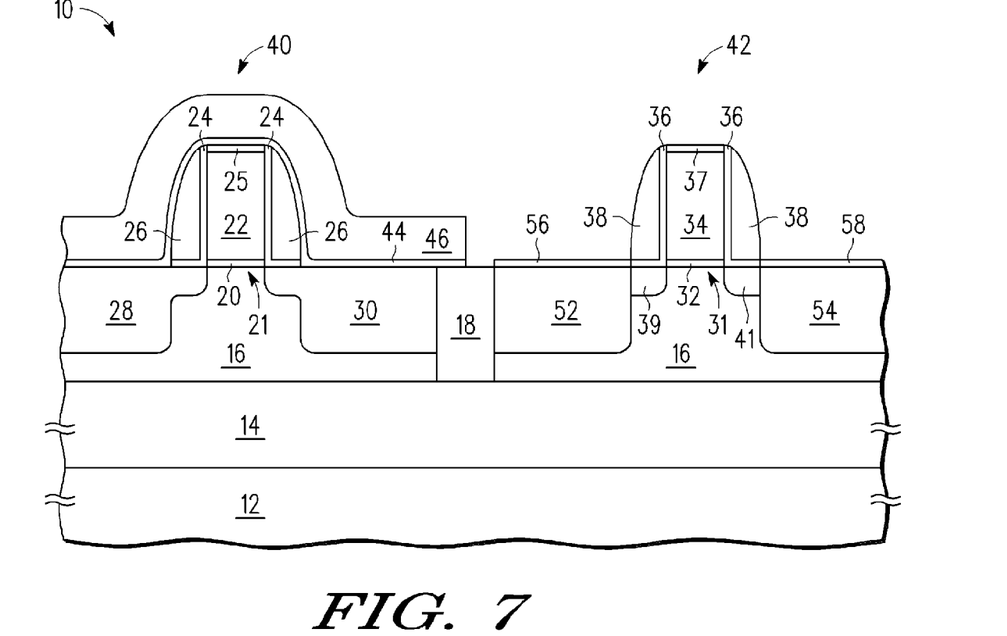
FIG. 7 is the semiconductor device 6 at a subsequent stage in processing.

Shown in FIG. 7 is semiconductor device 10 after further growing an undoped semiconductor layer 56 on SiGe layer 52 and an undoped semiconductor layer 58 on SiGe layer 54. This can be achieved by simply stopping the flow of dopant, boron in this case, during the epitaxial growth process. There may still be some dopant in undoped semiconductor layers 56 and 58 but significantly lower than for SiGe layers 52 and 54. SiGe layers 52 and 54 in this example may have a boron concentration of about 5e20 (five times ten to the twentieth) atoms per centimeter cubed. In this case undoped means not more than 1e16 atoms per centimeter cubed of source/drain dopant which is boron in this P channel case. Undoped semiconductor layers 56 and 58 are about 100 Angstroms thick in this example. Other thicknesses may be effective. Rather than just stopping the flow of boron, the flow of germanium may also be stopped so that undoped semiconductor layers 56 and 58 are simply silicon instead of SiGe. Because undoped semiconductor layers 56 and 58 are relatively thin and will be later be converted to silicide, they do not adversely impact the stress that is applied to channel 31 so being silicon should not result in a negative impact on the applied stress.

Figure 8:
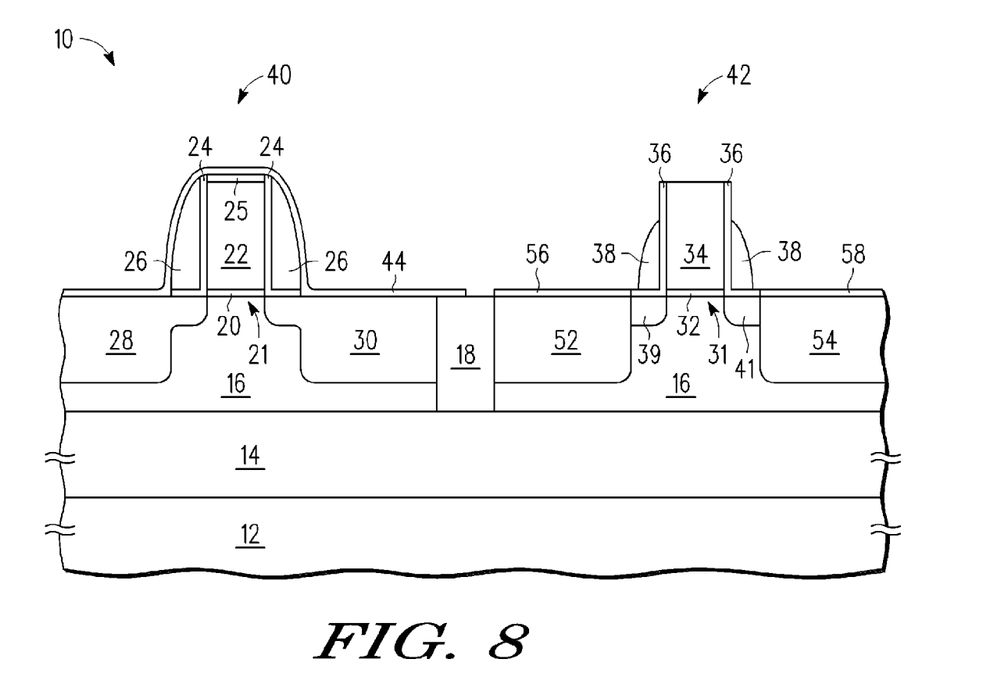
FIG. 8 is the semiconductor device 7 at a subsequent stage in processing.

Shown in FIG. 8 is semiconductor device 10 after removing stressor layer 46. The etch for achieving this is intentionally not a patterned etch so as to have the affect of reducing the size of sidewall spacer 38. The etchant for this etch is chosen to be selective to oxide so that liner 36 and liner 44 remain substantially unetched and thereby protects source/drain regions from the nitride etchant. In this example, the etchant is phosphoric acid. This can be either a dry etch or a wet etch. Undoped semiconductor layers 56 and 58 are also not etched by the nitride etchant because they are undoped. Thus doped layers 52 and 54 are protected from phosphoric acid erosion. If the undoped layers 56 and 58 were not present, after application of phosphoric acid, one doped SiGe region may simply be rough, another may have a deep pin hole, and another may have a wide and deep recess. All of these are undesirable but the variance in affect makes it difficult to compensate for the adverse affect.

Figure 9:
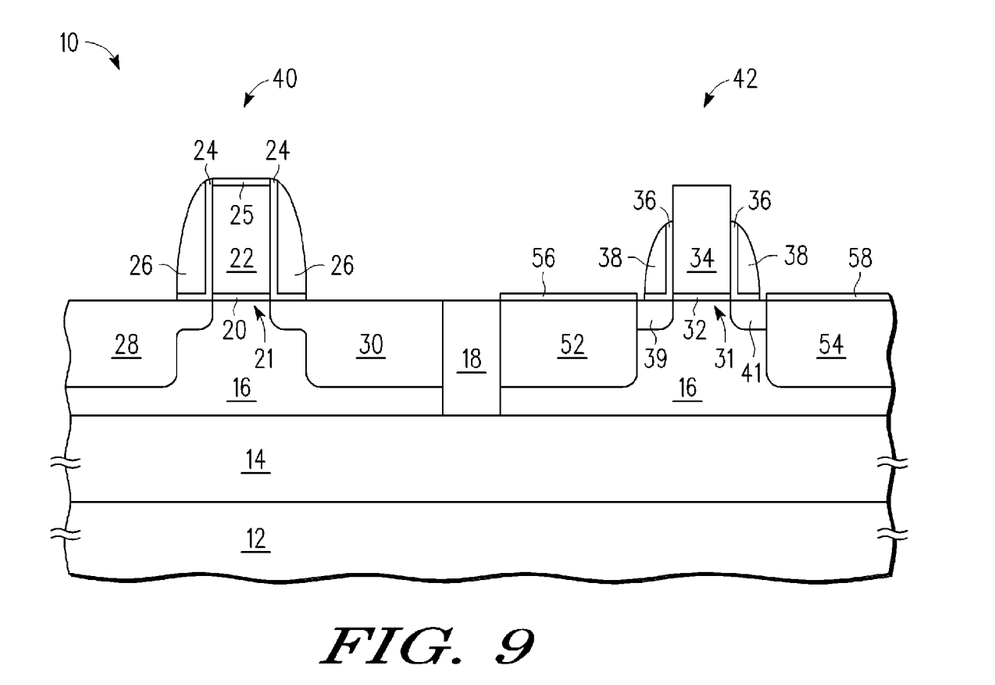
FIG. 9 is the semiconductor device 8 at a subsequent stage in processing.

Shown in FIG. 9 is semiconductor device 10 after an oxide etch which removes liner 44 and the exposed portion of liner 36. This exposes capping layer 25.

Figure 10:
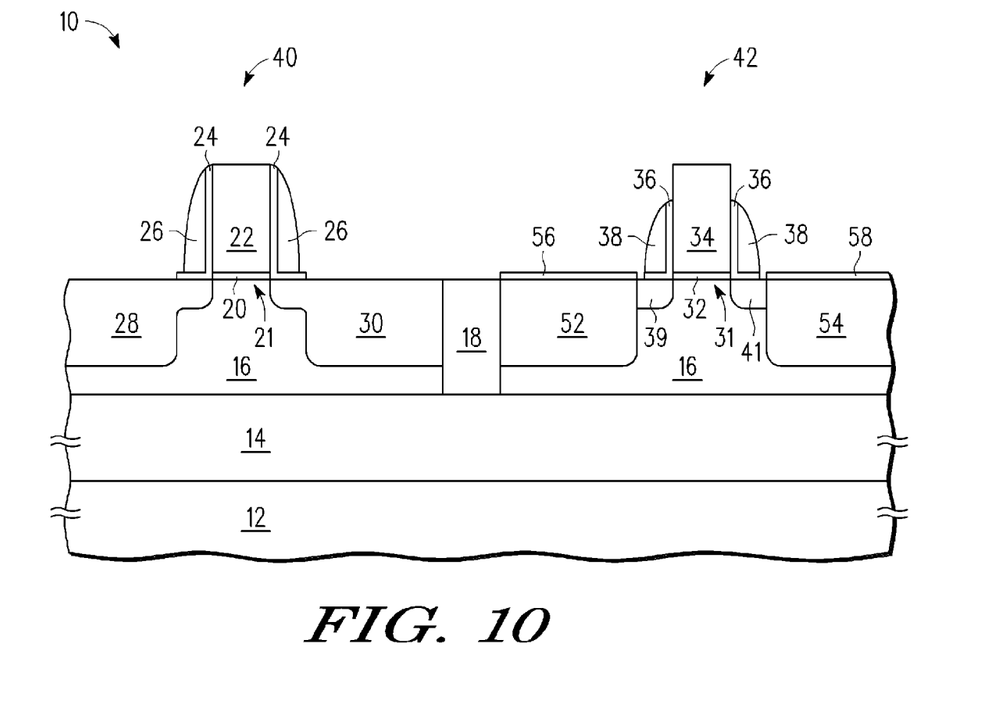
FIG. 10 is the semiconductor device 9 at a subsequent stage in processing.

Shown in FIG. 10 is semiconductor device 10 after a nitride etch which removes capping layer 25 and also provide a small reduction in sidewall spacers 26 and 38.

Figure 11:
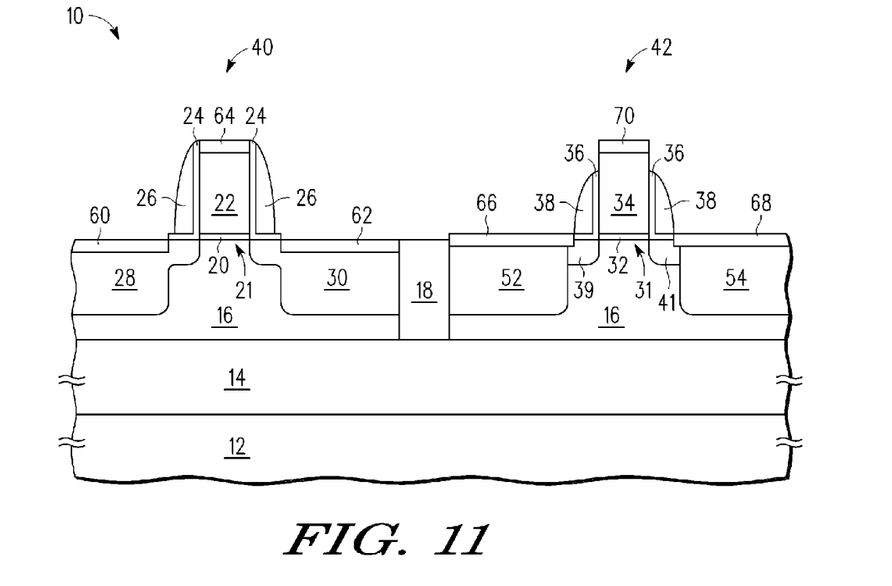
FIG. 11 is the semiconductor device 10 at a subsequent stage in processing.

Shown in FIG. 11 is semiconductor device 10 after a silicidation step which causes the formation of silicide region 60 in over source/drain region 28, silicide region 62 over source/drain region 30, a silicide region 64 over gate electrode 22, a silicide region 66 over source/drain region 52, a silicide region 68 over source/drain region 54, and a silicide region 70 over gate electrode 34. Silicide regions 66 and 68 completely consume undoped semiconductor layers 56 and 58, respectively, and top portions of source/drain regions 52 and 52 and 54 respectively. Thus, none of the source/drains of region 42 are undoped. For the case where undoped semiconductor layers 56 and 58 are undoped SiGe, silicide regions 66 and 68 also contain germanium.

Figure 12:
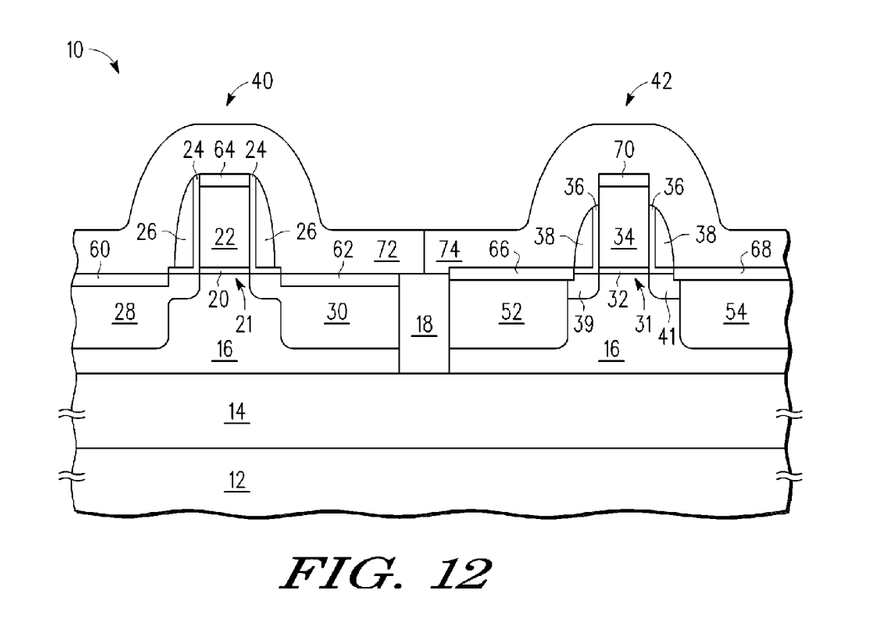
FIG. 12 is the semiconductor device 11 at a subsequent stage in processing.

Shown in FIG. 12 is semiconductor device 10 after forming stressor 72 over region 40 and a stressor 74 or region 42. Stressors 72 are preferably nitride with stressor 72 being tensile and stressor 74 being compressive. Stressors 72 and 74 may be formed by a conventional dual stressor techniques. One benefit of this structure of FIG. 12 is that sidewall spacer 38 has been thinned so that stressor 74 is closer to channel 31 and thus provides more stress to channel 31.

By now it should be appreciated that there has been provided an effective approach for providing a semiconductor device using a disposable stressor.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, various dimensions could be varied or further varied than from what is described. Also a specific etchant material was described for removing nitride selective to oxide but another material could also be used and a thin semiconductor layer could be grown which is not adversely impacted by the etchant. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Accordingly a method for a semiconductor device that includes steps of providing substrate, forming a p-channel device and an n-channel device, forming a liner over the p-channel and the n-channel device, forming a tensile stressor layer over the liner, removing a portion of the tensile stressor layer from a region overlying the p-channel device, transferring a stress characteristic, using the remaining portion of the tensile stressor layer, and growing a semiconductor material. The forming a p-channel device and an n-channel device uses the substrate wherein each of the p-channel device and the n-channel device comprise a source, a drain, and a gate, the p-channel device has a first sidewall spacer, and the n-channel device has a second sidewall spacer. The transferring a stress characteristic is of an overlying portion of a remaining portion of the tensile stressor layer to a channel of the n-channel device. The using the remaining portion of the tensile stressor layer is as a hard mask in forming a first recess and a second recess adjacent the gate of the p-channel device. The growing a semiconductor material is in the first recess and the second recess. There may be formed an un-doped semiconductor layer overlying the semiconductor material. There may be removed the remaining portion of the tensile stressor layer from a region overlying the n-channel device. The removing the remaining portion of the tensile stressor layer from the region overlying the n-channel device may comprise etching the semiconductor device such that the first sidewall spacer is reduced in size compared with the second sidewall spacer. There may be removed a remaining portion of the liner overlying the n-channel device. There may be a nitride cap formed over the gate of the n-channel device, and there may be removed the nitride cap after removing the remaining portion of the liner overlying the n-channel device. There may be formed silicide regions corresponding to the n-channel device and the p-channel device. There may be formed dual-stress etch-stop layers overlying the p-channel device and the n-channel device to create additional stress in a channel region of the n-channel device and a channel region of the p-channel device.

Further, a method for forming a semiconductor device includes providing a substrate, forming a p-channel device and an n-channel device using the substrate, forming a liner over the p-channel device and the n-channel device, forming a tensile stressor layer over the liner, removing a portion of the tensile stressor layer from a region overlying the p-channel device, transferring a stress characteristic of an overlying portion of a remaining portion of the tensile stressor layer to a channel of the n-channel device, using the remaining portion of the tensile stressor layer as a hard mask in forming a first recess and a second recess adjacent the gate of the p-channel device, growing a semiconductor material in the first recess and the second recess, forming an un-doped semiconductor layer overlying the semiconductor material, and removing the remaining portion of the tensile stressor layer from a region overlying the n-channel device. The forming the p-channel and the n-channel device is further characterized by each of the p-channel device and the n-channel device comprising a source, a drain, and a gate, the p-channel device having a first sidewall spacer, and the n-channel device having a second sidewall spacer. The removing the remaining portion of the tensile stressor layer may comprise etching the semiconductor device such that the first sidewall spacer is reduced in size compared with the second sidewall spacer. There may be removed a remaining portion of the liner overlying the n-channel device. A nitride cap may be formed over the gate of the n-channel device, and there may be removed the nitride cap after removing the remaining portion of the liner overlying the n-channel device. There may be formed silicide regions corresponding to the n-channel device and the p-channel device. There may be formed dual-stress etch-stop layers overlying the p-channel device and the n-channel device to create additional stress in a channel region of the n-channel device and a channel region of the p-channel device.

Also, a method for forming a semiconductor device includes providing a substrate, forming a first device having a first type of conductivity and a second device using the substrate, forming a liner over the first device and the second device, forming a tensile stressor layer over the liner, removing a portion of the tensile stressor layer from a region overlying the first device, transferring a stress characteristic of an overlying portion of a remaining portion of the tensile stressor layer to a channel of the second device, using the remaining portion of the tensile stressor layer as a hard mask, forming a first recess and a second recess adjacent the gate of the first device, growing a semiconductor material in the first recess and the second recess, and forming an un-doped semiconductor layer overlying the semiconductor material. The forming a first device having a first type of conductivity and a second device having a second type of conductivity is further characterized by each of the first device and the second device comprising a source, a drain, and a gate, the first device having a first sidewall spacer, and the second device having a second sidewall spacer. The method may be further characterized by the first device is a p-channel device and the second device is an n-channel device. There may be removed a remaining portion of the liner overlying the n-channel device. A nitride cap may be formed over the gate of the n-channel device, and there may be removed the nitride cap after removing the remaining portion of the liner overlying the n-channel device. There may be formed silicide regions corresponding to the n-channel device and the p-channel device. There may be formed a dual etch-stop layer overlying the p-channel device and the n-channel device to create additional stress in the channel region of the n-channel device and a channel region of the p-channel device.

What is claimed is:

1. A method for forming a semiconductor device comprising:
   providing a substrate;
   forming a p-channel device and an n-channel device using the substrate, each of the p-channel device and the n-channel device comprising a source, a drain, and a gate, the p-channel device having a first sidewall spacer and the n-channel device having a second sidewall spacer;
   forming a liner over the p-channel device and the n-channel device;
   forming a tensile stressor layer over the liner;
   removing a portion of the tensile stressor layer from a region overlying the p-channel device;
   transferring a stress characteristic of an overlying portion of a remaining portion of the tensile stressor layer to a channel of the n-channel device;
   using the remaining portion of the tensile stressor layer as a hard mask, forming a first recess and a second recess adjacent the gate of the p-channel device;
   growing a semiconductor material in the first recess and the second recess; forming an un-doped semiconductor layer overlying the semiconductor material; and
   removing the remaining portion of the tensile stressor layer from a region overlying the n-channel device comprising etching the semiconductor device such that the first sidewall spacer is reduced in size compared with the second sidewall spacer.

2. The method of claim 1, further comprising removing a remaining portion of the liner overlying the n-channel device.

3. The method of claim 2, wherein a nitride cap is formed over the gate of the n-channel device, and wherein the method further comprising removing the nitride cap after removing the remaining portion of the liner overlying the n-channel device.

4. The method of claim 3, further comprising forming silicide regions corresponding to the n-channel device and the p-channel device.

5. The method of claim 4 further comprising forming dual-stress etch-stop layers overlying the p-channel device and the n-channel device to create additional stress in a channel region of the n-channel device and a channel region of the p-channel device.

6. A method for forming a semiconductor device comprising:
   providing a substrate;
   forming a p-channel device and an n-channel device using the substrate, each of the p-channel device and the n-channel device comprising a source, a drain, and a gate, the p-channel device having a first sidewall spacer and the n-channel device having a second sidewall spacer;
   forming a liner over the p-channel device and the n-channel device;
   forming a tensile stressor layer over the liner;
   removing a portion of the tensile stressor layer from a region overlying the p-channel device;
   transferring a stress characteristic of an overlying portion of a remaining portion of the tensile stressor layer to a channel of the n-channel device;
   using the remaining portion of the tensile stressor layer as a hard mask, forming a first recess and a second recess adjacent the gate of the p-channel device;
   growing a semiconductor material in the first recess and the second recess;
   forming an un-doped semiconductor layer overlying the semiconductor material; and
   removing the remaining portion of the tensile stressor layer from a region overlying the n-channel device comprising etching the semiconductor device such that the first sidewall spacer is reduced in size compared with the second sidewall spacer.

7. The method of claim 6, further comprising removing a remaining portion of the liner overlying the n-channel device.

8. The method of claim 7, wherein a nitride cap is formed over the gate of the n-channel device, and wherein the method further comprising removing the nitride cap after removing the remaining portion of the liner overlying the n-channel device.

9. The method of claim 8, further comprising forming silicide regions corresponding to the n-channel device and the p-channel device.

10. The method of claim 9, further comprising forming dual-stress etch-stop layers overlying the p-channel device and the n-channel device to create additional stress in a channel region of the n-channel device and a channel region of the p-channel device.

11. A method for forming a semiconductor device comprising:
    providing a substrate;
    forming a first device having a first type of conductivity and a second device having a second type of conductivity using the substrate, each of the first device and the second device comprising a source, a drain, and a gate, the first device having a first sidewall spacer and the second device having a second sidewall spacer;
    forming a liner over the first device and the second device;
    forming a tensile stressor layer over the liner;
    removing a portion of the tensile stressor layer from a region overlying the first device;
    transferring a stress characteristic of an overlying portion of a remaining portion of the tensile stressor layer to a channel of the second device;
    using the remaining portion of the tensile stressor layer as a hard mask, forming a first recess and a second recess adjacent the gate of the first device;
    growing a semiconductor material in the first recess and the second recess;
    forming an un-doped semiconductor layer overlying the semiconductor and removing the remaining portion of the tensile stressor layer comprising etching the second sidewall spacer to reduce a size of the second sidewall spacer while the first sidewall spacer is protected from the etching.

12. The method of claim 11, wherein the first device is a p-channel device and the second device is an n-channel device.

13. The method of claim 12, further comprising removing a remaining portion of the liner overlying the n-channel device.

14. The method of claim 12, wherein a nitride cap is formed over the gate of the n-channel device, and wherein the method further comprising removing the nitride cap after removing the remaining portion of the liner overlying the n-channel device.

15. The method of claim 14, further comprising forming silicide regions corresponding to the n-channel device and the p-channel device.

16. The method of claim 15 further comprising forming a dual etch-stop layer overlying the p-channel device and the n-channel device to create additional stress in the channel region of the n-channel device and a channel region of the p-channel device.

* * * * *